(12) United States Patent
Liu et al.

(10) Patent No.: US 9,871,031 B2
(45) Date of Patent: Jan. 16, 2018

(54) SEMICONDUCTOR DEVICE AND AN ELECTRONIC APPARATUS

(71) Applicant: SEMICONDUCTOR MANUFACTURING INTERNATIONAL (SHANGHAI) CORPORATION

(72) Inventors: Yi Liu, Shanghai (CN); Jun Wang, Shanghai (CN); Ying Ma, Shanghai (CN); Bin Lu, Shanghai (CN); Huijuan Cheng, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/934,949

(22) Filed: Nov. 6, 2015

(65) Prior Publication Data

US 2016/0133621 A1    May 12, 2016

(30) Foreign Application Priority Data

Nov. 7, 2014   (CN) .......................... 2014 1 0625364

(51) Int. Cl.
*H01L 27/02* (2006.01)
*H01L 29/74* (2006.01)
*H01L 29/66* (2006.01)
*H01L 29/87* (2006.01)
*H01L 29/739* (2006.01)

(52) U.S. Cl.
CPC ...... *H01L 27/0262* (2013.01); *H01L 29/6609* (2013.01); *H01L 29/87* (2013.01); *H01L 27/0277* (2013.01); *H01L 29/7391* (2013.01); *H01L 29/7436* (2013.01)

(58) Field of Classification Search
CPC .................................................... H01L 27/0262
See application file for complete search history.

(56) References Cited

U.S. PATENT DOCUMENTS 6,081,002 A  *  6/2000  Amerasekera ...... H01L 27/0266
                                                257/173
6,498,357 B2 * 12/2002 Ker ........................ H01L 29/87
                                                257/173

(Continued)

*Primary Examiner* — Victor A Mandala
*Assistant Examiner* — Regan J Rundio
(74) *Attorney, Agent, or Firm* — Kilpatrick Townsend and Stockton LLP

(57) ABSTRACT

A semiconductor device includes a P-type substrate, and an N-well in the P-type substrate. A first N+ diffusion region is located in the P-type substrate, and a first P+ diffusion region is located in the N-well. A second P+ diffusion region is located across a boundary between the P-type substrate and the N-well. A first gate electrode overlies the N-well between the first P+ diffusion regions and the second P+ diffusion region. A second gate electrode overlies the P-type substrate between the second P+ diffusion region and the first N+ diffusion region. The first P+ diffusion region, the N-well, the P-type substrate, and the first N+ diffusion region form an SCR (Silicon-Controlled rectifier) device. The first P+ diffusion region, the second P+ diffusion region, and the first gate electrode form a PMOS transistor. The second P+ diffusion region, the first N+ diffusion region, and the second gate electrode form a gated diode.

13 Claims, 3 Drawing Sheets

(56) References Cited

U.S. PATENT DOCUMENTS

| | | | | |
|---|---|---|---|---|
| 6,521,952 B1* | 2/2003 | Ker | ................... | H01L 27/0262 |
| | | | | 257/141 |
| 6,806,160 B2* | 10/2004 | Ker | ...................... | H01L 29/87 |
| | | | | 257/E29.225 |
| 7,202,114 B2* | 4/2007 | Salcedo | ............. | H01L 29/7436 |
| | | | | 257/173 |
| 2005/0270710 A1* | 12/2005 | Ker | ................... | H01L 29/7436 |
| | | | | 361/56 |
| 2005/0275029 A1* | 12/2005 | Watt | ...................... | H01L 29/87 |
| | | | | 257/355 |
| 2007/0131965 A1* | 6/2007 | Kim | .................. | H01L 27/0262 |
| | | | | 257/173 |
| 2014/0159206 A1* | 6/2014 | Hsu | .................... | H01L 29/735 |
| | | | | 257/565 |

\* cited by examiner

SEMICONDUCTOR DEVICE AND AN ELECTRONIC APPARATUS

CROSS-REFERENCES TO RELATED APPLICATIONS

This application claims priority to Chinese patent application No. 201410625364.9, filed on Nov. 7, 2014, the content of which is incorporated herein by reference in its entirety.

BACKGROUND OF THE INVENTION

The present invention relates to the field of semiconductor technology. Specifically, embodiments of the invention relate to semiconductor device electrostatic discharge (ESD) protection structures and manufacturing methods.

In the field of semiconductor technology, the electrostatic discharge (ESD) phenomenon is a major threat to the integrated circuit. With the decreasing device dimensions in semiconductor process technology, ESD protection design becomes more challenging and difficult in nanoscale CMOS technologies.

In conventional technologies, SCR (silicon-controlled rectifier) devices are widely used as ESD protection devices. FIG. 1 is a cross-sectional view of a conventional SCR device with equivalent circuits also illustrated. As shown in FIG. 1, a conventional SCR device includes an N-well 101 in the P-type substrate 100. An N+ diffusion region 104 and a P+ diffusion region 105 are located in P-type substrate 100. A P+ diffusion region 102 and an N+ diffusion region 103 are also located within the N-well 101. P+ diffusion region 102 is coupled to the anode of the SCR device. P+ diffusion region 102 and N+ diffusion region 103 are coupled to a first pad PAD1. An N+ diffusion region 103 provides an ohmic contact to N-Well 101. N+ diffusion region 104 is the cathode of the SCR device. A P+ diffusion region 105 provides an ohmic contact to P-type substrate 100. N+ diffusion region 104 and P+ diffusion region 105 are coupled to a second pad PAD2. In this example, PAD1 is used as an IO pad, and PAD2 is used as a ground pad.

In the above SCR device, when a positive ESD appears briefly on the IO pad (PAD1) and the ground pad (PAD2), the SCR device forms a low impedance discharge channel to shunt the ESD current.

However, the inventors have observed that, in semiconductor devices at 28 nm manufacturing process node and below, the conventional SCR devices often provide trigger voltages that are too high to protect the internal circuitry. In addition, the conventional SCR devices often have holding voltages that are too low and can be susceptible to latch-up effects.

There is a need for an improved SCR device structure.

BRIEF SUMMARY OF THE INVENTION

Embodiments of the present invention provide an ESD protection device structure that can provide a lower trigger voltage and higher holding voltage than conventional SCR devices. In an embodiment, a semiconductor device includes an ESD protection device structure. The semiconductor device includes an SCR device structure with two cross-coupled PNP and NPN transistors formed in an N-well and P-type substrate. In addition, the semiconductor device includes an additional diffusion region across a boundary of the N-well and P-type substrate and two gate electrodes to form a PMOS transistor and a gated diode. The trigger voltage of the SCR device is lower than a traditional SCR device, and the performance for ESD protection is improved.

According to some embodiments of the present invention, a semiconductor device includes a P-type substrate and an N-well in the P-type substrate. A first N+ diffusion region is located in the P-type substrate, and a first P+ diffusion region is located in the N-well. A second P+ diffusion region is located across a boundary between the P-type substrate and the N-well. A first gate electrode is located overlying the N-well between the first P+ diffusion regions and the second P+ diffusion region. A second gate electrode is located overlying the P-type substrate between the second P+ diffusion region and the first N+ diffusion region. The first P+ diffusion region, the second P+ diffusion region, and the first gate electrode form a PMOS structure. The second P+ diffusion region, the first N+ diffusion region, and the second gate electrode form a gated diode structure.

In an embodiment, the first P+ diffusion region, the N-well, the P-type substrate, and the first N+ diffusion region form an SCR (Silicon-Controlled rectifier) device.

In an embodiment, the first gate electrode is connected to the first P+ diffusion region, and both are connected to a first pad.

In an embodiment, the second gate electrode is connected to the first N+ diffusion region, and both are connected to a second pad.

In an embodiment, the device also has a second N+ diffusion region in a surface region of the N-type well. In an embodiment, the second N+ diffusion region is coupled to the first pad.

In an embodiment, the device also has a third P+ diffusion region in a surface region of the P-type substrate. In an embodiment, the third P+ diffusion region is coupled to the second pad.

In an embodiment, the device also has a high-k dielectric metal gate transistor.

According to some embodiments of the invention, a semiconductor device includes an ESD protection device structure according to an embodiment of the present invention. The semiconductor device includes a P-type substrate, and an N-well in the P-type substrate. A first N+ diffusion region is located in the P-type substrate, and a first P+ diffusion region is located in the N-well. A second P+ diffusion region is located across a boundary between the P-type substrate and the N-well. In other words, a part of P+ diffusion region is located in the N-well, and another part is in the P-type substrate. Further, a first gate electrode is disposed overlying the N-well between the first P+ diffusion region and the second P+ diffusion region. A second gate electrode is disposed overlying the P-type substrate between the second P+ diffusion region and the first N+ diffusion region. The first P+ diffusion region, the N-well, the P-type substrate, and the first N+ diffusion region form an SCR (Silicon-Controlled rectifier) device. The first P+ diffusion region, the second P+ diffusion region, and the first gate electrode form a PMOS structure. The second P+ diffusion region, the first N+ diffusion region, and the second gate electrode form a gated diode structure.

In some embodiments, the semiconductor device also has a second N+ diffusion region in a surface region of the N-type well. In some embodiments, the first gate electrode, the first P+ diffusion region, and the second N+ diffusion region are coupled to a first pad.

In some embodiments, the semiconductor device also includes a third P+ diffusion region in a surface region of the P-type substrate. In some embodiments, the second gate electrode, the first N+ diffusion region, and the third P+ diffusion region are coupled to a second pad.

According to another embodiment of the present invention, an electronic apparatus includes a semiconductor device and an electronic assembly connected to the semiconductor device. The semiconductor device includes a P-type substrate, and an N-well in the P-type substrate. A first N+ diffusion region is located in the P-type substrate, and a first P+ diffusion region is located in the N-well. A second P+ diffusion region is located across a boundary between the P-type substrate and the N-well. In other words, a part of the P+ diffusion region is located in the N-well, and another part is in the P-type substrate. Further, a first gate electrode is disposed overlying the N-well between the first P+ diffusion regions and the second P+ diffusion region. A second gate electrode is disposed overlying the P-type substrate between the second P+ diffusion region and the first N+ diffusion region. The first P+ diffusion region, the N-well, the P-type substrate, and the first N+ diffusion region form an SCR (Silicon-Controlled rectifier) device. The first P+ diffusion region, the second P+ diffusion region, and the first gate electrode form a PMOS structure. The second P+ diffusion region, the first N+ diffusion region, and the second gate electrode form a gated diode structure.

In an embodiment, the semiconductor device further includes a second N+ diffusion region in a surface region of the N-type well. In an embodiment, the first gate electrode, the first P+ diffusion region, and the second N+ diffusion region are coupled to a first pad.

In an embodiment, the semiconductor device further includes a third P+ diffusion region in a surface region of the P-type substrate. In an embodiment, the second gate electrode, the first N+ diffusion region, and the third P+ diffusion region are coupled to a second pad.

In an embodiment, the semiconductor device further comprises a high-k metal gate transistor.

The following description, together with the accompanying drawings, will provide further understanding of the nature and advantages of the claimed invention.

DETAILED DESCRIPTION OF THE INVENTION

Figure 1:
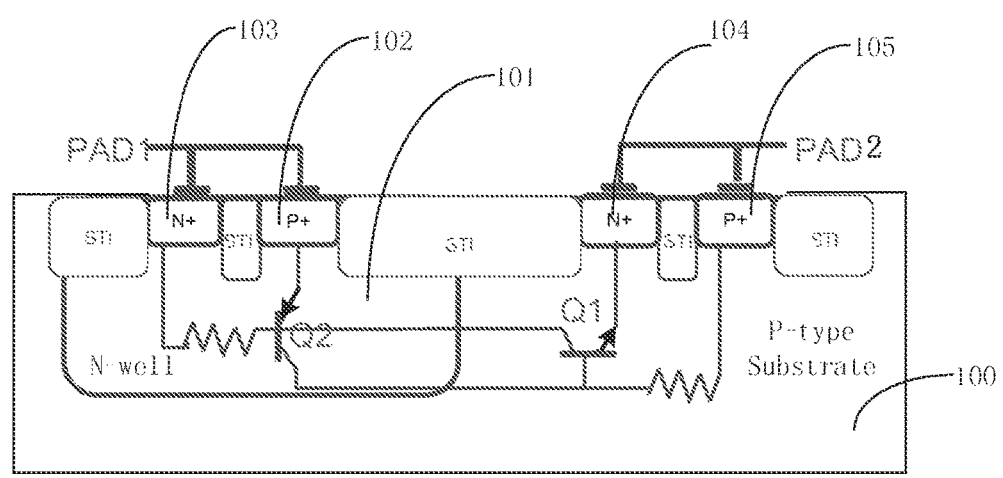
FIG. 1 is a cross-sectional diagram illustrating a conventional SCR semiconductor device.

Embodiments of the present invention provide an isolation structure, its manufacturing method, and related electronic devices.

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Embodiments of the invention are described herein with reference to cross-section illustrations that are schematic illustrations of idealized embodiments (and intermediate structures) of the invention. The thickness of layers and regions in the drawings may be exaggerated relative to each other for clarity. Additionally, variations in the illustrated shapes resulting, for example, from manufacturing techniques and/or tolerances, are to be expected. Thus, embodiments of the invention should not be construed as limited to the particular shapes of regions illustrated herein but are to include deviations in shapes that result, for example, from manufacturing.

It will be understood that, when an element or layer is referred to as "on," "disposed on," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," directly disposed on," "directly connected to," or "directly coupled to" another element or layer, there are no intervening elements or layers present between them. It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Relative terms, or spatial relationship terms, such as "under," "below," "underneath," "over," "on," "above," "bottom," and "top" are used herein to describe a relationship of one element, layer or region to another element, layer or region as illustrated in the figures. It will be understood that these terms are intended to encompass different orientations of the structure in addition to the orientation depicted in the figures. For example, if the device shown in the figures is flipped, the description of an element being "below" or "underneath" another element would then be oriented as "above" the other element. Therefore, the term "below," "under," or "underneath" can encompass both orientations of the device. Because devices or components of embodiments of the present invention can be positioned in a number of different orientations (e.g., rotated 90 degrees or at other orientations), the relative terms should be interpreted accordingly.

The terms "a," "an," and "the" may include singular and plural references. It will be further understood that the terms "comprising," "including," "having" and variants thereof, when used in this specification, specify the presence of stated features, steps, operations, elements, and/or components, but do not preclude the presence or addition of one or more other features, steps, operations, elements, components, and/or groups thereof. Furthermore, as used herein, the words "and/or" may refer to and encompass any possible combinations of one or more of the associated listed items.

The use of the terms "first," "second," etc. do not denote any order, but rather the terms "first," "second," etc. are used to distinguish one element from another. Furthermore, the use of the terms "a," "an," etc. does not denote a limitation of quantity, but rather denote the presence of at least one of the referenced items.

The term "vertical" as used in this application is defined as a plane perpendicular to the conventional plane or surface of a wafer or substrate, regardless of the orientation of the wafer or substrate. The term "horizontal" refers to a direction perpendicular to the vertical as defined above.

Embodiments of the invention are described herein with reference to cross-section illustrations that are schematic illustrations of idealized embodiments (and intermediate structures) of the invention. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Prepositions, such as "on," "side" (as in "sidewall"), "below," "above," "higher," "lower," "over," and "under" are defined with respect to the conventional plane or surface being on the top surface of the wafer or substrate, regardless of the orientation of the water or substrate. It will be understood that these terms are intended to encompass different orientations of the device in addition to the orientation depicted in the figures.

The description below is presented with reference to a series of drawing figures enumerated above. These diagrams are merely examples, and should not unduly limit the scope of the claims herein. In connection with the various aspects illustrated and described, one of ordinary skill in the art would recognize other variations, modifications, and alternatives.

Figure 2:
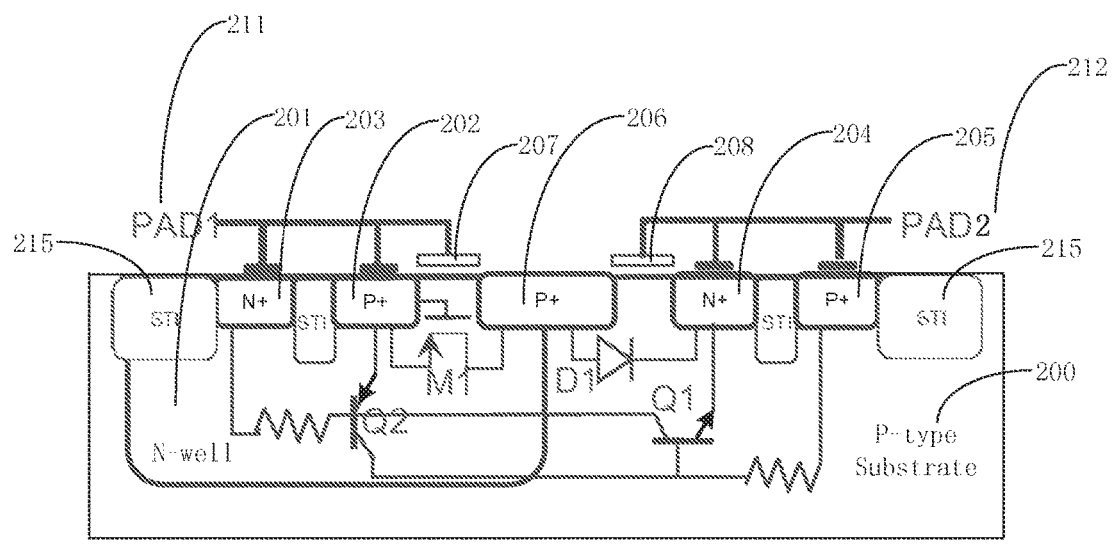
FIG. 2 is a cross-sectional diagram illustrating a semiconductor device including an ESD protection device structure according to an embodiment of the present invention.

FIG. 2 is a cross-sectional diagram illustrating a semiconductor device including an ESD protection device structure according to an embodiment of the present invention. As shown in FIG. 2, the semiconductor device includes a P-type substrate 200, and an N-well 201 in the P-type substrate. A first N+ diffusion region 204 is located in the P-type substrate, and a first P+ diffusion region 202 is located in the N-well. In FIG. 2, a second P+ diffusion region 206 is located across a boundary between the P-type substrate and the N-well. In other words, a part of P+ diffusion region 206 is located in the N-well, and another part is in the P-type substrate. Further, a first gate electrode 207 is disposed overlying the N-well between the first P+ diffusion regions 202 and the second P+ diffusion region 206. A second gate electrode 208 is disposed overlying the P-type substrate between the second P+ diffusion region 206 and the first N+ diffusion region 204.

The semiconductor device in FIG. 2 also includes a second N+ diffusion region 203 in a surface region of the N-type well to provide an ohmic contact to the N-type well. The first gate electrode, the first P+ diffusion region, and the second N+ diffusion region are coupled to a first pad 211 (PAD1). The semiconductor device in FIG. 2 also includes a third P+ diffusion region 205 in a surface region of the P-type substrate to provide an ohmic contact to the P-type substrate. The second gate electrode, the first N+ diffusion region, and the third P+ diffusion region are coupled to a second pad 212 (PAD2).

In FIG. 2, first P+ diffusion region 202, N-well 201, the P-type substrate 200, and the first N+ diffusion region 204 form an SCR (Silicon-Controlled rectifier) device. It can be seen that the SCR device includes two bipolar transistors Q1 and Q2 coupled in a feedback loop. NPN transistor Q1 includes the P-type substrate as the base, the N-well as the collector, and N+ region 204 as the emitter. PNP transistor Q2 includes the N-well as the base, the P-type substrate as the collector, and P+ region 202 as the emitter. The SCR device structure includes two transistors connected in a positive feedback configuration, similar to a conventional SCR device. When a positive ESD appears briefly on the IO pad (PAD1) and the ground pad (PAD2), SCR device forms a low impedance discharge channel to shunt the ESD current.

In contrast to a conventional SCR device, in embodiments of the invention, the semiconductor device includes an additional PMOS transistor and a gated diode formed by P+ diffusion region 206 and two gate electrodes 207 and 208. As shown in FIG. 2, the first P+ diffusion region 202, the second P+ diffusion region 206, and the first gate electrode 207 form a PMOS structure M1. Further, the second P+ diffusion region 206, the first N+ diffusion region 204, and the second gate electrode 208 form a gated diode structure (D1).

In the semiconductor device according to an embodiment of the present invention, when a positive ESD appears to the first pad PAD1, a breakdown can occur at the reverse PN junction formed by N-well 201 and the P+ diffusion region 206. In contrast, in the traditional SCR device, the junction breakdown mechanism mainly occurs at the reverse PN junction formed by the N-well and the P-type substrate. Therefore, the breakdown mechanism requires a lower trigger voltage in the semiconductor device according to an embodiment of the present invention. Moreover, in the presence of gate electrode 207, the gate-induced currents will further reduce the trigger voltage. In addition, the holding voltage of SCR device can be further improved by the PMOS transistor M1 and gated diode D1 Thus, the performance of SCR devices is improved, and a better ESD protection performance is provided.

The semiconductor device of the embodiment of the present invention is compatible with existing semiconductor manufacturing processes (e.g., 28 nm process and below), and no additional process costs will be incurred. For example, the P+ diffusion region 206, the first gate 207, and the second gate 208 may be implemented in using conventional semiconductor device manufacturing processes, with no additional mask film process. Merely as an example, P+ diffusion region 206 can be formed in the same process for forming P+ diffusion regions 202 and 205, e.g., using implantation. Gate electrodes 207 and 208 can be formed in the same process as the gate electrodes for the transistor, e. g., using polysilicon deposition and etching. The semiconductor device of the present invention, in addition to the above-described ESD protection structure, also may include shallow trench isolation (STI) as shown in FIG. 2, and other components for forming a transistor circuit or the like. For example, the semiconductor device of the present invention can include transistors with high K dielectric and metal gate structures, or other types of transistor.

Figure 3:
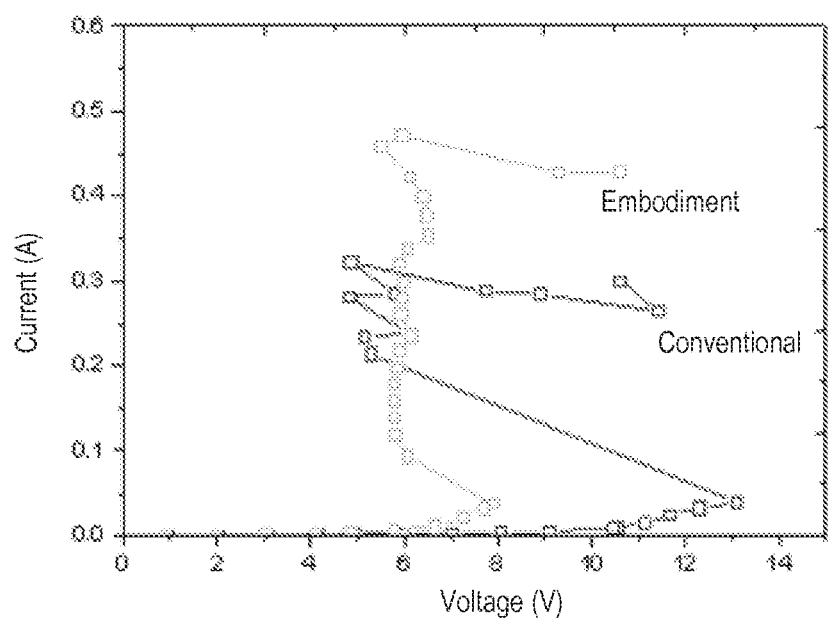
FIG. 3 is a current-voltage plot comparing the performance of a conventional SCR semiconductor device and an ESD protection device structure according to an embodiment of the present invention.

FIG. 3 is a current-voltage plot comparing the performance of a conventional SCR semiconductor device and an ESD protection device structure according to an embodiment of the present invention. The data were obtained by TLP (transmission line pulse) testing. It can be seen that, compared with the conventional SCR device, the ESD protection semiconductor device in embodiments of the invention has a lower trigger voltage, and can provide better ESD protection performance.

Embodiments of the present invention also provide an electronic apparatus that includes the above-described ESD protection device structure. The electronic apparatus can include a semiconductor device with the ESD device protection structure and electronic components connected to the semiconductor device. The semiconductor device includes a semiconductor device formed using the manufacturing method described above, or a semiconductor device described above. The electronic component can include discrete devices and integrated circuits, or other electronic components.

By including the isolation pocket structure, the electronic apparatus can have excellent performance, with the advantages described above. The electronic device may include a mobile phone, tablet PCs, laptops, notebooks, game consoles, televisions, VCD, DVD, navigation, camera, video camera, voice recorder, MP3, MP4, PSP, and other electronic products or equipment. Embodiments of the present invention also provide intermediate products having the above-described semiconductor device, for example: a mobile phone motherboard that includes the integrated circuit, and the like.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A semiconductor device comprising:
a P-type substrate;
an N-well in the P-type substrate;
a first N+ diffusion region in the P-type substrate;
a first P+ diffusion region in the N-well;
a second P+ diffusion region located across a boundary between the P-type substrate and the N-well;
a third P+ diffusion region in the P-type substrate;
a first gate electrode overlying the N-well between the first P+ diffusion regions and the second P+ diffusion region;
a second gate electrode overlying the P-type substrate between the second P+ diffusion region and the first N+ diffusion region and connected to the third P+ diffusion region, and both being connected to a ground pad;
wherein the first P+ diffusion region, the second P+ diffusion region, and the first gate electrode form a PMOS structure;
wherein the second P+ diffusion region, the first N+ diffusion region, and the second gate electrode form a gated diode structure; and
wherein the first gate electrode is connected to the first P+ diffusion region, and both are connected to an input/output (IO) pad.

2. The device of claim 1, wherein the first P+ diffusion region, the N-well, the P-type substrate, and the first N+ diffusion region form an SCR (Silicon-Controlled rectifier) device.

3. The device of claim 1, wherein the second gate electrode is connected to the first N+ diffusion region.

4. The device of claim 1, further comprising a second N+ diffusion region in a surface region of the N-type well.

5. The device of claim 4, wherein the second N+ diffusion region is coupled to the IO pad.

6. The device of claim 1, further comprising a high-k dielectric metal gate transistor.

7. An electronic device, comprising:
a P-type substrate;
an N-well in the P-type substrate;
a first N+ diffusion region in the P-type substrate;
a first P+ diffusion region in the N-well;
a second P+ diffusion region located across a boundary between the P-type substrate and the N-well;
a third P+ diffusion region in the P-type substrate;
a first gate electrode overlying the N-well between the first P+ diffusion regions and the second P+ diffusion region;
a second gate electrode overlying the P-type substrate between the second P+ diffusion region and the first N+ diffusion region and connected to the third P+ diffusion region, and both being connected to a ground pad;
wherein the first P+ diffusion region, the N-well, the P-type substrate, and the first N+ diffusion region form an SCR (Silicon-Controlled rectifier) device;
wherein the first P+ diffusion region, the second P+ diffusion region, and the first gate electrode form a PMOS structure;
wherein the second P+ diffusion region, the first N+ diffusion region, and the second gate electrode form a gated diode structure; and
wherein the first gate electrode, the first P+ diffusion region, and the second N+ diffusion region are coupled to an input/output (TO) pad.

8. The device of claim 7, further comprising a second N+ diffusion region in a surface region of the N-type well.

9. The device of claim 7, wherein the second gate electrode is connected to the first N+ diffusion region.

10. An electronic apparatus, comprising a semiconductor device and an electronic assembly connected to said semiconductor device, wherein the semiconductor device comprises:
a P-type substrate;
an N-well in the P-type substrate;
a first N+ diffusion region in the P-type substrate;
a first P+ diffusion region in the N-well;
a second P+ diffusion region located across a boundary between the P-type substrate and the N-well;
a third P+ diffusion region in the P-type substrate;
a first gate electrode overlying the N-well between the first P+ diffusion region and the second P+ diffusion region;
a second gate electrode overlying the P-type substrate between the second P+ diffusion region and the first N+ diffusion region and connected to the third P+ diffusion region, and both being connected to a ground pad;
wherein the first P+ diffusion region, the N-well, the P-type substrate, and the first N+ diffusion region form an SCR (Silicon-Controlled rectifier) device;

wherein the first P+ diffusion region, the second P+ diffusion region, and the first gate electrode form a PMOS structure;

wherein the second P+ diffusion region, the first N+ diffusion region, and the second gate electrode form a gated diode structure; and wherein the first gate electrode, the first P+ diffusion region, and the second N+ diffusion region are coupled to an input/output (IO) pad.

11. The apparatus of claim 10, wherein the semiconductor device further comprises a second N+ diffusion region in a surface region of the N-type well.

12. The apparatus of claim 10, wherein the second gate electrode is connected to the first N+ diffusion region.

13. The apparatus of claim 10, wherein the semiconductor device further comprises a high-k metal gate transistor.

* * * * *